US012755626B2

(12) United States Patent
Andreyo et al.

(10) Patent No.: US 12,755,626 B2
(45) Date of Patent: Oct. 6, 2026

(54) ION PUMP MONITORED VACUUM INTERRUPTER

(71) Applicant: Southern States, LLC, Hampton, GA (US)

(72) Inventors: Joseph Andreyo, Fayettville, GA (US); Lawrence B Beagen, Fayetteville, GA (US); Joseph R Rostron, McDonough, GA (US)

(73) Assignee: SOUTHERN STATES, LLC, Hampton, GA (US)

( * ) Notice: Subject to any disclaimer, the term of this patent is extended or adjusted under 35 U.S.C. 154(b) by 104 days.

(21) Appl. No.: 18/910,025

(22) Filed: Oct. 9, 2024

(65) Prior Publication Data

US 2025/0131812 A1 Apr. 24, 2025

Related U.S. Application Data

(60) Provisional application No. 63/592,545, filed on Oct. 23, 2023.

(51) Int. Cl.
*G08B 21/18* (2006.01)
*G01R 31/327* (2006.01)

(52) U.S. Cl.
CPC ....... *G08B 21/182* (2013.01); *G01R 31/3274* (2013.01)

(58) Field of Classification Search
CPC .......................... G08B 21/182; G01R 31/3274
See application file for complete search history.

(56) References Cited

U.S. PATENT DOCUMENTS

| | | | | |
|---|---|---|---|---|
| 4,103,291 | A * | 7/1978 | Howe | G01R 31/3274 361/120 |
| 5,539,602 | A * | 7/1996 | Schmitz | H02H 3/32 361/42 |
| 6,462,331 | B1 * | 10/2002 | Choi | H01J 37/3171 250/251 |

(Continued)

OTHER PUBLICATIONS

Agilent Technologies, Agilent lon Pumps, accessed Apr. 13, 2023.
Miniature and 2 l/s Vaclon Pumps, Miniature and 2 l/s Vaclon Pumps, accessed Apr. 13, 2023.

*Primary Examiner* — Thomas D Alunkal
(74) *Attorney, Agent, or Firm* — MEHRMAN LAW OFFICE; Michael Mehrman

(57) ABSTRACT

A ion pump vacuum monitored vacuum interrupter uses the voltage already applied to the interrupter to power the vacuum ion pump. A porcelain tube in fluid communication with the interrupter vacuum bottle provides high voltage isolation between the vacuum interrupter bottle and the vacuum ion pump to protect the pump. When connected to the porcelain tube, the ion pump maintains the purity of the vacuum medium inside the vacuum interrupter bottle, while failure of the ion pump indicates a vacuum failure. Failure of the ion pump triggers response actions, such as activating a visual indicator, activating other alarms, disabling the switch until the vacuum interrupter is repaired, and entering a maintenance order. This allows the life of the vacuum interrupter to be significantly increased while simultaneously improving the reliability and safety of operating vacuum interrupters.

15 Claims, 5 Drawing Sheets

(56) References Cited

U.S. PATENT DOCUMENTS

| | | | | |
|---|---|---|---|---|
| 8,287,247 | B2 * | 10/2012 | Bonucci | H01J 41/12<br>417/49 |
| 9,106,070 | B2 * | 8/2015 | Carlino | H02H 1/06 |
| 11,942,292 | B2 * | 3/2024 | Choi | G01R 31/3274 |
| 2008/0088991 | A1 * | 4/2008 | Elms | H01H 83/20<br>361/42 |
| 2016/0293372 | A1 * | 10/2016 | Walsh | H02H 3/044 |
| 2019/0036324 | A1 * | 1/2019 | Jimenez | H02H 3/10 |
| 2020/0194200 | A1 * | 6/2020 | Bishop | H01H 33/668 |
| 2020/0241072 | A1 * | 7/2020 | Okerman | G01R 31/327 |

* cited by examiner

SECTION A-A

ION PUMP MONITORED VACUUM INTERRUPTER

REFERENCE TO RELATED APPLICATION

This application claims filing priority to U.S. Provisional Patent Application Ser. No. 63/592,545 filed Oct. 23, 2023, which is incorporated by reference.

TECHNICAL FIELD

This invention pertains to high voltage electrical switchgear and, more specifically, to an electric power vacuum interrupter utilizing an ion pump vacuum monitor and response system.

BACKGROUND

One downside to using vacuum interrupter technology is that the vacuum level inside of the interrupter bottle cannot be measured or maintained. This leads to reliability and safety concerns for utilities that utilize this technology. If the interrupter is called upon to break load when the vacuum level is not adequate, the interrupter bottle will fail. This failure can cause significant damage to utility equipment and can also injure personnel. This also leads to unexpected outages and equipment replacement which have a substantial financial impact.

SUMMARY

The shortcomings of conventional vacuum interrupters are mitigated by an ion pump monitored vacuum interrupter including a vacuum bottle containing an interrupter contactor. An ion pump housing containing an ion pump is in fluid communication with the vacuum bottle. A vacuum medium fills the vacuum bottle and the ion pump housing. A power supply provides electric power harvested from the electric power line to the ion pump, which purifies the vacuum medium by removing contamination ions from the vacuum medium during normal operation of the ion pump. The ion pump fails when overwhelmed by contamination ions due to a failure of the interrupter bottle. An ion pump controller detects failure of the ion pump and initiates one or more response actions in response to the detected failure.

It will be understood that specific embodiments may include a variety of features in different combinations, and that all of the features described in this disclosure, or any particular set of features, need not be included in a particular embodiment. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DESCRIPTION OF ILLUSTRATIVE EMBODIMENTS

Electric power vacuum interrupters are used in a variety of high-voltage electric power switches generally referred to as circuit breakers, interrupters, reclosers, disconnect switches, and so forth. In general, the term vacuum interrupter as used in the disclosure means any type of electric power switch that includes an electric contact in a vacuum environment. A vacuum ion pump is an electro-physical vacuum purification device that removes gases from its vacuum environment by turning those gasses into solid materials. Vacuum interrupter bottles have not been fitted with a vacuum ion pump before. The ion pump monitored vacuum interrupter uses the voltage already applied to the interrupter to power the vacuum ion pump. A porcelain tube in fluid communication with the interrupter vacuum bottle provides high voltage isolation between the vacuum interrupter bottle and the vacuum ion pump to protect the pump. When connected to the porcelain tube, the ion pump maintains the purity of the vacuum medium inside the vacuum interrupter bottle, while failure of the ion pump indicates a vacuum failure. Failure of the ion pump triggers response actions, such as activating a visual indicator, activating other alarms, disabling the switch until the vacuum interrupter is repaired, and entering a maintenance order. This allows the life of the vacuum interrupter to be significantly increased while simultaneously improving the reliability and safety of operating vacuum interrupters.

Figure 1:
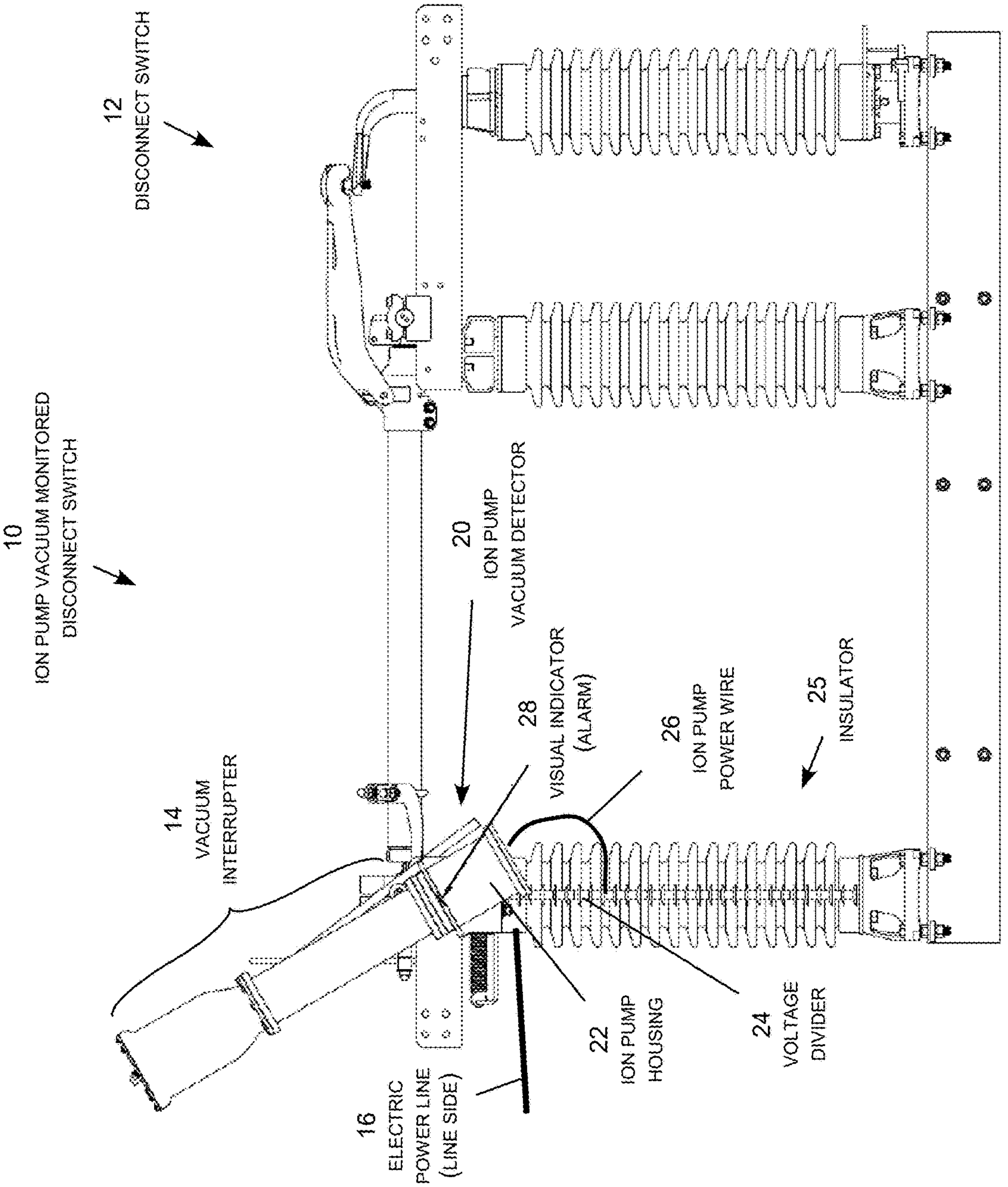
FIG. 1 is a front view of an ion pump vacuum monitored disconnect switch.
Figure 2:
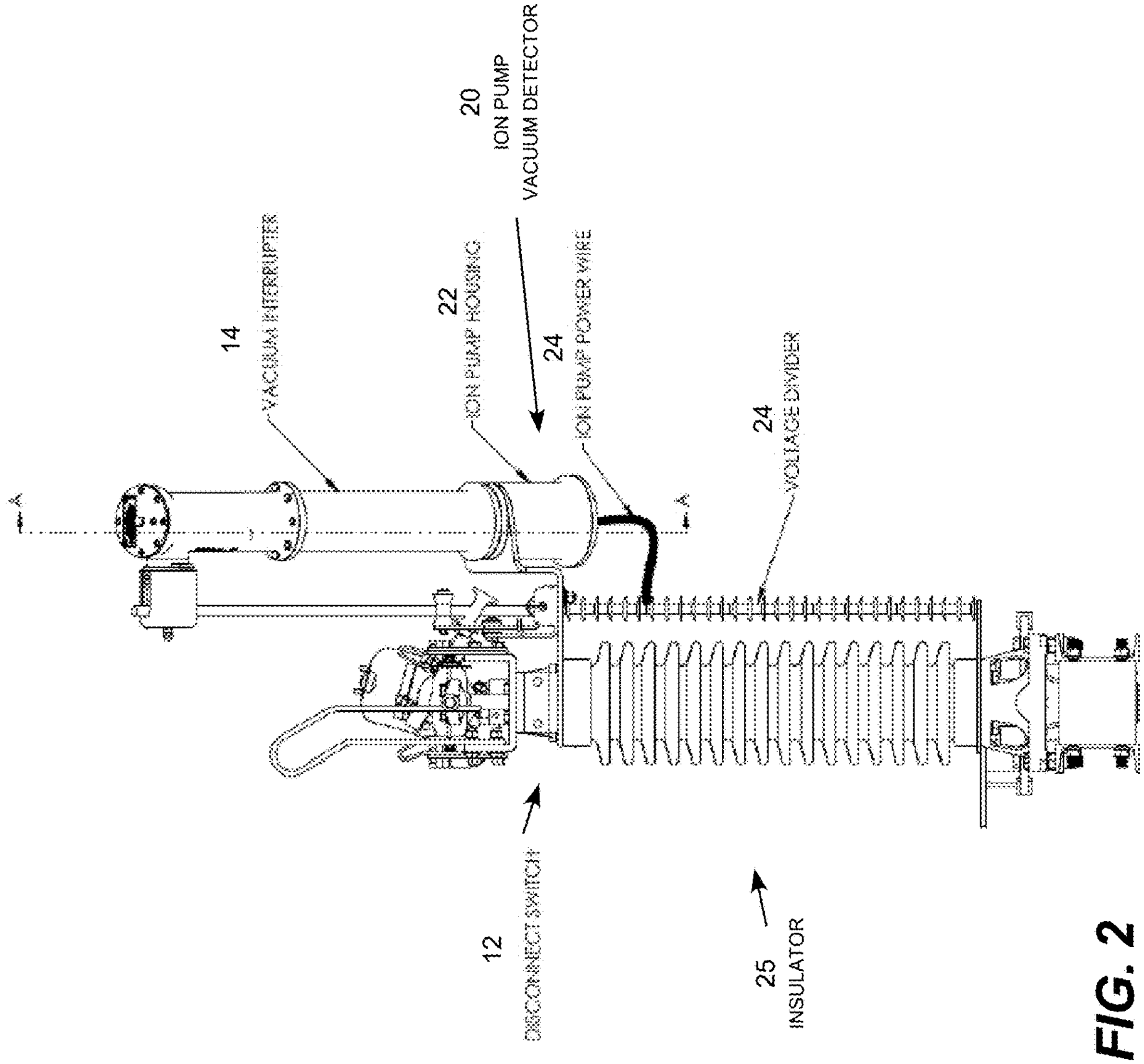
FIG. 2 is a side view of the ion pump vacuum monitored disconnect switch.

FIG. 1 is a front view and FIG. 2 is a side view of an ion pump vacuum monitored disconnect switch 10 including a disconnect switch 12 and a vacuum interrupter 14 connected to a power line 16. Only one electric power phase is shown as a similar device can be utilized for each electric power phase of a 3-phase electric power line. The innovation includes an ion pump vacuum detector 20, which serves two functions. First, during normal switch operations, the ion pump vacuum detector purifies the vacuum within the interrupter vacuum bottle by removing gas ions from the vacuum medium inside the interrupter vacuum bottle. The ion pump performs this function whenever the ion pump vacuum detector 20 is energized and the infiltration of gas into the vacuum medium remains in the normal range. Second, when a vacuum failure occurs, the ion pump becomes overwhelmed by the gas ions infiltration and fails. Failure of the ion pump detects the vacuum failure and triggers one or more response actions. The response system can include, for example, activating a visual indicator, activating other alarms, disabling the switch until the vacuum interrupter is repaired, and entering a maintenance order.

Although a disconnect switch provides a representative example, the ion pump may be used to purify and monitor the vacuum environment in other types of electric power switches, such as circuit breakers, reclosers, and so forth. The representative embodiment of the present invention is enabled through an ion pump vacuum detector 20 including an ion pump housing 22 connected to the bottom of the vacuum interrupter 14. In this embodiment, an AC voltage divider 24 is positioned parallel to the switch insulator 25 in the electric field of the power line 16, where the line-to-ground voltage of the power line 16 appears across the voltage divider 24. The voltage divider 24 positions the ion pump power wire 26 in the electric field of the power line 16 to capacitively couple the ion pump power wire to the AC power line 16. This allows the ion pump power wire 26 to capacitively harvest the desired AC voltage from the line-to-ground voltage of the power line 16 to operate the ion pump vacuum detector 20. The ion pump vacuum detector 20 also includes a visual indicator (alarm) 28 on the outside of the ion pump housing 22 activated in response to a detected ion pump failure indicating a failure of the interrupter vacuum bottle.

Figure 3:
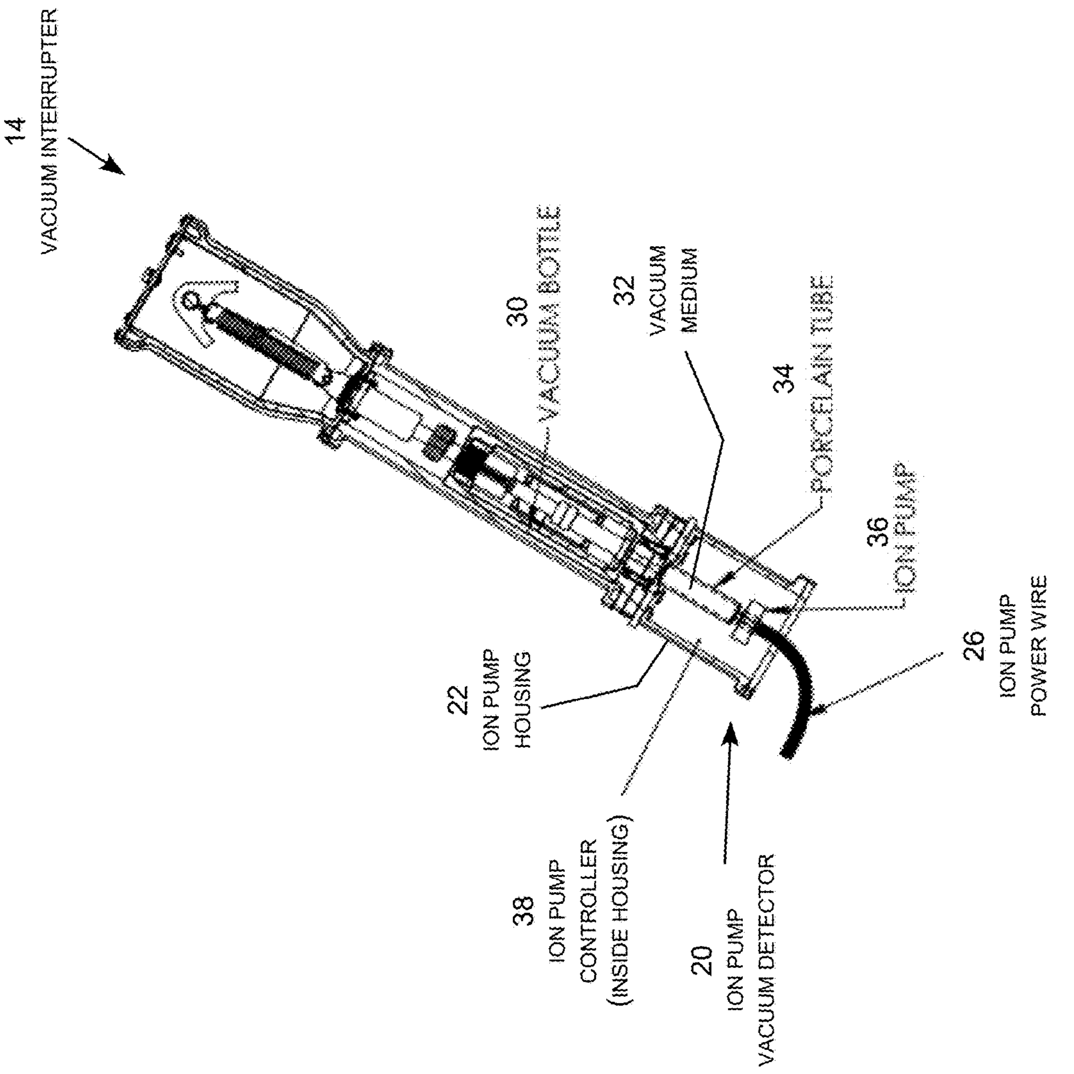
FIG. 3 is a sectional view of an ion pump vacuum interrupter.
Figure 4:
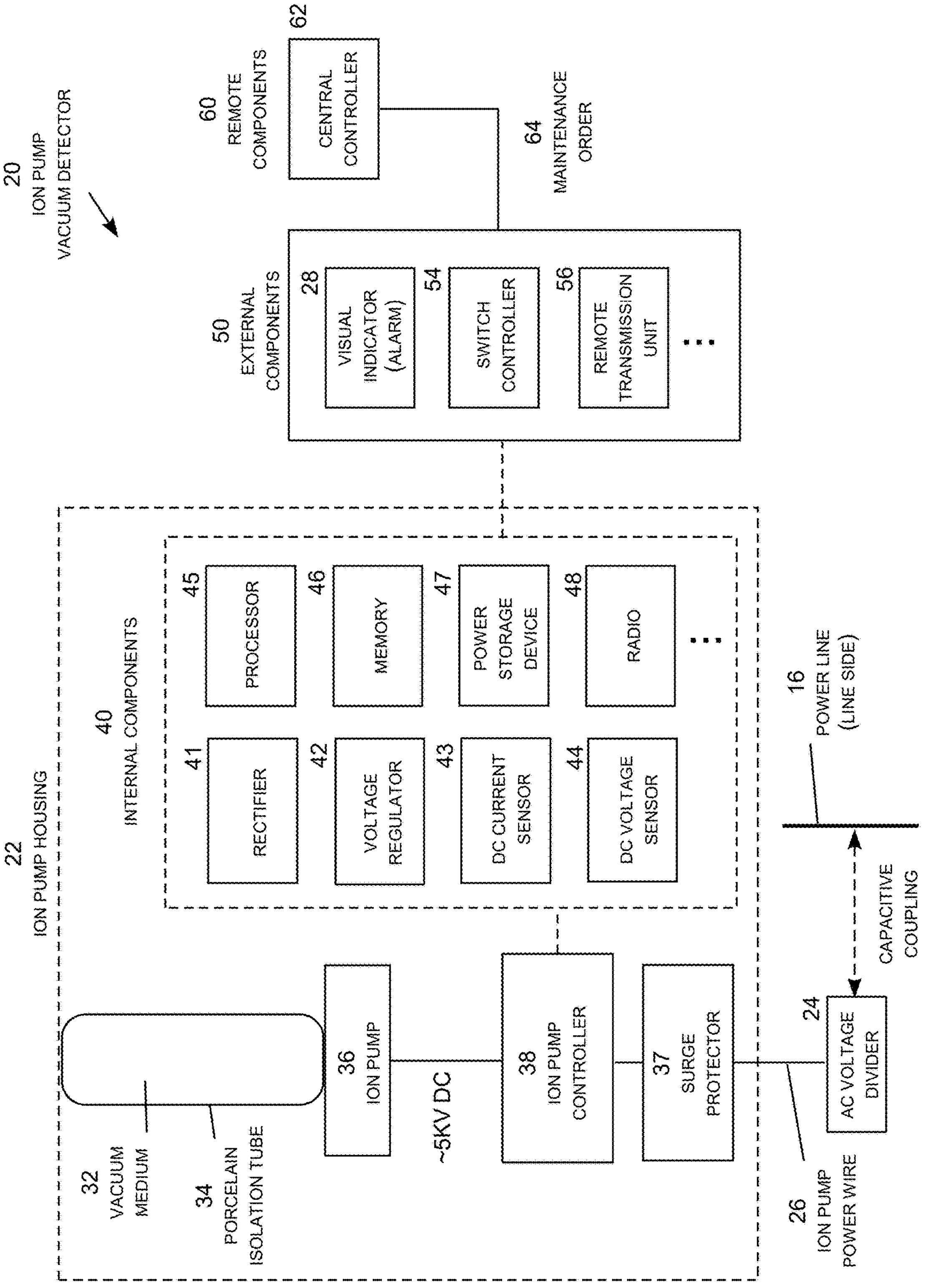
FIG. 4 is a schematic diagram of an ion pump vacuum detector.

FIG. 3 is a sectional view of the vacuum interrupter 14 and ion pump vacuum detector 20. The vacuum interrupter 14 includes a vacuum bottle 30 that houses the interrupter. The ion pump vacuum detector 20 includes a porcelain tube 24 in fluid communication with the interrupter medium 32 inside the vacuum bottle 30. The porcelain tube 24 is also in fluid communication with an ion pump 36. The porcelain tube 24 exposes the ion pump to the interrupter medium 32 inside the vacuum bottle 30 while providing high voltage isolation between the vacuum interrupter bottle and the vacuum ion pump to protect the pump. The ion pump 36 is energized by the ion pump controller 38 and operates visual indicator 28 and other components internal and external to the ion pump housing 22 as shown in FIG. 4.

The ion pump 36 serves two functions. First, the ion pump 36 continually purifies the vacuum medium 32, which flows into the porcelain tube 34. During normal operation of the vacuum interrupter 14, a relatively small amount of gas appears in the vacuum medium 32 as a result of normal seal leakage. The ion pump 36 removes this level of gas from the vacuum medium 32 through the normal operation of the ion pump to continually purify the vacuum medium 32 during normal operation of the vacuum bottle 30 whenever the ion pump 36 is energized. Second, the ion pump 36 becomes overwhelmed and burns out when the vacuum medium 32 experiences a much larger infiltration of gas indicating a seal failure or other vacuum failure of the vacuum bottle 30. The ion pump controller 38 monitors the status of the ion pump 36 and activates the visual indicator 28 and may take additional response actions when it detects a failure of the ion pump indicating a failure of the vacuum bottle 30 causing a large infiltration of gas into the vacuum medium 32. The ion pump controller 38 detects four states of the ion pump 36 as shown in Table-1:

TABLE 1

| Ion Pump Condition | Ion Pump Status | Vacuum Status |
|---|---|---|
| Normal voltage<br>Normal current (e.g., 5-8 mA) | Normal (purifying vacuum medium) | Normal |
| Normal voltage<br>Zero current | Failed (burn out failure) | Failed |
| Zero Voltage<br>Non-zero current | Failed (short circuit failure) | Failed |
| Zero voltage<br>Zero current | Off | No status available |

FIG. 4 is a functional block diagram of the ion pump vacuum detector 20 including the ion pump 36, ion pump controller 38, and related components. In the embodiment shown in FIG. 4, the ion pump 36 and controller 38 harvest power from the AC power line 16. The AC voltage divider 24 positions the ion pump power wire 26 in the electric field of the power line 16 to capacitively harvest the desired AC voltage from the line-to-ground voltage across the voltage divider. The ion pump power wire 26 is connected to a surge protector 37 that filters out power disturbances, such as lightning and switching transients. While the surge protector is shown inside the ion pump housing 22, it may be located outside the housing if desired. After the surge protector 37, the ion pump power wire is connected to the ion pump controller 38 and then to the ion pump 36. The ion pump typically requires several thousand volts (e.g., 5 kV DC) and amperage in the milliamp range. The ion pump controller 38 includes internal components 40 and may interface with external component 50 and remote components 60. The internal components include a rectifier 41, voltage regulator 42, DC current sensor 43, DC voltage sensor 44, programmed processor 45, memory 46, power storage 47 (e.g., battery or capacitor), radio 48, and other components typically utilized in microprocessors. In this embodiment, the external components include the visual indicator (alarm) 28, a switch controller 54, and a remote transmission unit (RTU) 56. The RTU communicates with remote components 60, which in this example includes sending a maintenance order 64 to a central controller 62, which dispatches a repair crew in response to a detected failure of the ion pump 36 indicating a failure of the interrupter vacuum bottle 30.

Although different operating voltages may be utilized, a representative embodiment for a 69 kV power line is described. The line-to-ground voltage of the illustrated phase power line 16 is about 40 kV. The ion pump power wire 26 shown in FIG. 1 extends about 15% of the physical distance of the voltage divider 24 to inductively harvest sufficient AC voltage to produce several thousand volts DC after rectification and regulation by the ion pump controller 38 to operate the ion pump 36. Alternatively, the power supply 27 shown in FIG. 5 boosts the output voltage of the CT 23 to several thousand volts AC to provide comparable power to the ion pump controller 38. The rectifier 41 and voltage regulator 42 convert several thousand volts AC to a steady several thousand volts DC (e.g., 5 kV) supplied to the ion pump 36. The processor 45 utilizes measurements from the DC current sensor 43 and the DC voltage sensor 44 to determine the status of the ion pump 36, which indicates the status of the vacuum bottle 30 as shown in Table 1.

The memory 46 stores the operating software and may also store logs of the voltage and current measurements for diagnostic purposes. For example, an increase in the ion pump current may be used to detect an increased likelihood of a vacuum failure prior to occurrence of a complete vacuum failure. A wired connection or the radio 48 communicates information from the internal components 40 to the external components 50. An indication of vacuum failure activates the visual indicator (alarm) 28 and instructs the switch controller 54 to temporarily disable operation of the switch until the vacuum interrupter is repaired. The remote transmission unit 56 creates a maintenance order 64 for repair of the vacuum interrupter, which is relayed to the central controller 62 for dispatch of a repair crew.

Figure 5:
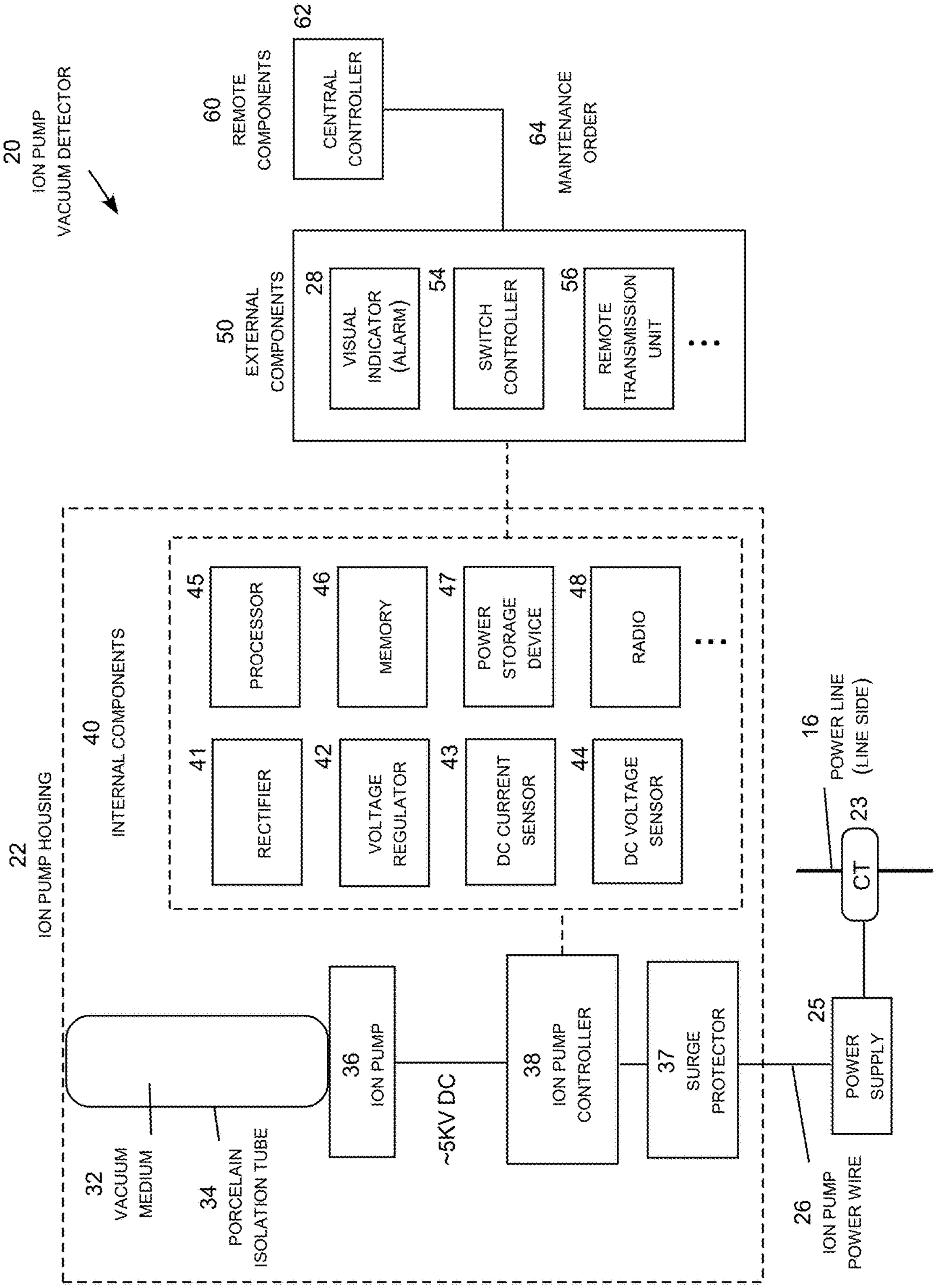
FIG. 5 is a schematic diagram of an alternative ion pump detector.

FIG. 5 shows an alternative embodiment in which the ion pump 36 and controller 38 are powered by a current transformer (CT) 23 positioned around power line 16. The CT 23 provides low-voltage AC power, typically in the range of several volts, to a power supply 27. The power supply includes a transformer boosting the AC voltage provided by the CT 23 to the desired range of several thousand Volts AC, which the rectifier 41 converts to several thousand Volts DC to operate the ion pump 36. The rectifier 41 may be located with the power supply 25, which may be located inside or outside the ion pump housing 22. Other power supply options may be utilized, such as a battery or other type of energy harvesting power supply. In general, powering the ion pump from the line side of the disconnect switch 12 is preferred to keep the ion pump energized whether the switch is open or closed.

In view of the foregoing, it will be appreciated that present invention provides significant improvements vacuum interrupters. The foregoing relates only to the exemplary embodiments of the present invention, and numerous changes may be made therein without departing from the spirit and scope of the invention as defined by the following claims.

The invention claimed is:

1. An ion pump monitored vacuum interrupter connected to an electric power line, comprising:

a vacuum bottle containing an interrupter contactor;

an ion pump housing containing an ion pump in fluid communication with the vacuum bottle;

a vacuum medium filling the vacuum bottle and the ion pump housing;

a power supply providing electric power to the ion pump;

the ion pump purifying the vacuum medium by removing contamination ions from the vacuum medium during normal operation of the ion pump;

the ion pump failing when overwhelmed by contamination ions due to a failure of the vacuum bottle;

an ion pump controller detecting failure of the ion pump and initiating one or more response actions in response to the detected failure.

2. The ion pump monitored vacuum interrupter of claim 1, further comprising a porcelain tube communicating the vacuum medium and providing voltage isolation between the vacuum bottle and the ion pump.

3. The ion pump monitored vacuum interrupter of claim 1, wherein the power supply comprises an ion pump power wire connecting the power supply to the ion pump positioned to harvest electric power from the power line to operate the ion pump.

4. The ion pump monitored vacuum interrupter of claim 1, wherein the power supply comprises a voltage divider coupled to the power line.

5. The ion pump monitored vacuum interrupter of claim 1, wherein the power supply comprises a current transformer inductively coupled to the power line.

6. The ion pump monitored vacuum interrupter of claim 1, wherein the one or more response actions comprises activating a visual alarm disposed on the exterior of the ion pump housing.

7. The ion pump monitored vacuum interrupter of claim 1, wherein the one or more response actions activating an alarm remote form the vacuum interrupter.

8. The ion pump monitored vacuum interrupter of claim 1, wherein the one or more response actions comprise deactivating the vacuum interrupter until the vacuum interrupter is repaired.

9. The ion pump monitored vacuum interrupter of claim 1, wherein the one or more response actions comprises generating a maintenance order for repair of the vacuum interrupter.

10. The ion pump monitored vacuum interrupter of claim 1, wherein the ion pump controller received AC power from the power supply and provides about five thousand volts DC to the ion pump.

11. The ion pump monitored vacuum interrupter of claim 1, wherein the power supply comprises a battery.

12. The ion pump monitored vacuum interrupter of claim 1, wherein the power supply provides electric power harvested from the electric power line to the ion pump.

13. The ion pump monitored vacuum interrupter of claim 12, wherein the power supply further comprises a power storage device.

14. The ion pump monitored vacuum interrupter of claim 13, wherein the power storage device comprises a capacitor.

15. The ion pump monitored vacuum interrupter of claim 13, wherein the power storage device comprises a battery.

* * * * *